United States Patent [19]
Lee et al.

[11] Patent Number: 5,658,815
[45] Date of Patent: Aug. 19, 1997

[54] METHOD OF FABRICATING SILICIDED LDD TRANSISTOR

[75] Inventors: Chang-Jae Lee, Choongchungbook-do; Tae Gak Kim, Seoul, both of Rep. of Korea

[73] Assignee: LG Semicon Co., Ltd., Cheongju, Rep. of Korea

[21] Appl. No.: 581,787

[22] Filed: Jan. 2, 1996

[30]    Foreign Application Priority Data

Apr. 21, 1995 [KR] Rep. of Korea .................... 9422/1995

[51] Int. Cl.$^6$ ................................................. H01L 21/265
[52] U.S. Cl. ........................... 438/304; 438/305; 438/392; 438/396
[58] Field of Search ............................. 437/44, 200, 41

[56]           References Cited

U.S. PATENT DOCUMENTS

| | | | |
|---|---|---|---|
| 4,777,150 | 10/1988 | Deneuville et al. ............. | 437/200 |
| 4,853,347 | 8/1989 | Bukhman et al. ................ | 437/192 |
| 5,089,432 | 2/1992 | Yoo .................................. | 437/40 |
| 5,146,291 | 9/1992 | Watabe et al. . | |
| 5,444,024 | 8/1995 | Anjum et al. .................... | 437/200 |
| 5,472,896 | 12/1995 | Chen et al. ....................... | 437/44 |
| 5,508,212 | 4/1996 | Wang et al. ...................... | 437/24 |
| 5,543,340 | 8/1996 | Lee .................................. | 437/44 |

FOREIGN PATENT DOCUMENTS

2-304934A  12/1990  Japan .

*Primary Examiner*—John Niebling
*Assistant Examiner*—Richard A. Booth
*Attorney, Agent, or Firm*—Fleshner & Kim

[57]           ABSTRACT

A gate-drain overlapped device, comprising: a first conductive type substrate; a gate insulating film formed on the substrate; a gate comprising a gate conductive line patterned on the gate insulating film, and a conductive layer coated on the gate conductive line and extending to a predetermined length on the gate insulating film; and a drain/source region comprising a second conductive type low density diffusion region in the substrate below the extending area of the conductive layer and a second conductive type high density diffusion region in contact with the low density diffusion region in the substrate, which is significantly improved in the resistance of a polysilicon gate conductive line and in uniform electrical properties.

9 Claims, 7 Drawing Sheets

METHOD OF FABRICATING SILICIDED LDD TRANSISTOR

BACKGROUND OF THE INVENTION

1. Field of the Invention

The present invention relates to a gate-drain overlapped device (hereinafter referred to as "GOLD") and a method for fabricating the same. More particularly, the present invention relates to a GOLD comprising a silicide layer on the surface of a polysilicon gate conductive line, which results in a significant improvement in the resistance of a polysilicon gate conductive line and in uniform electrical properties, and to a method for fabricating the same.

2. Description of the Prior Art

In MOSFETs, the gate length has sharply been reduced with the progressive high integration of semiconductor devices. Reduction of the gate length into less than 0.5 μm turned out to deleteriously affects the reliability and the breakdown voltage. Accordingly, a fundamental change in the structure of MOSFET as well as in operating voltage has been required for the high integration of semiconductor devices.

In response to the requirement, drain engineering methods such as double diffused drain (DDD) and lightly doped drain (LDD) were newly suggested, with the aim of improving the reliability of MOSFETs. However, the drain engineering methods are proven to be unable to bring about high reliability and good performance at an operating voltage of 5 V because there is a tradeoff between the transconductance and the breakdown voltage. This is attributed to the fact that the drain engineering methods intend to optimize only the length of $n^-$ diffusion region (In) and the density of $n^-$ diffusion region (Nd).

In the meanwhile, the overlapped length between the gate and the drain was recognized to be a very important factor in controlling the characteristics of device. Based on this recognition, GOLD was suggested as an optimized structure to satisfy high reliability, superior performance and high breakdown voltage, without accompaniment of the tradeoff.

While the LDD structure uses a weak gate-drain overlap effect, the GOLD structure takes advantage of a strong gate-drain overlap effect. An inverse T LDD (ITLDD) structure, a kind of GOLD, was suggested to solve the problem of hot carrier deterioration attributable to the weak gate-drain overlap effect.

Such GOLD can be improved in reliability through the reduction of the horizontal electromagnetic field and hot carrier injection by the vertical electromagnetic field which is generated by the overlapped gate having an optimized gate-drain overlapped length. Thus, GOLD is a structure that allows the gate-drain overlap length to be optimized.

In order to better understand the background of the invention, a description of a conventional fabrication method of ITLDD will be given in conjunction with FIGS. 1A to 1E.

Figure 1A:
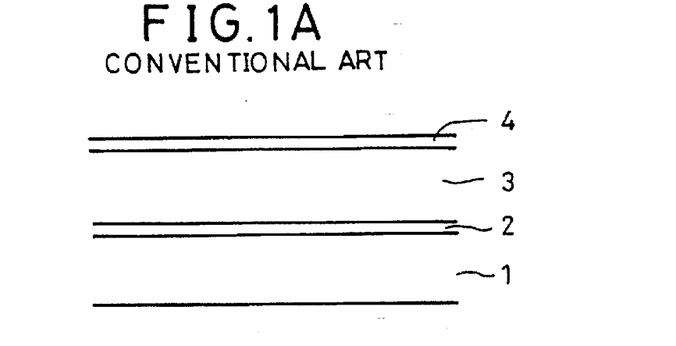
FIGS. 1A through 1E are schematic cross sectional views showing a fabrication method of a conventional gate-drain overlapped device.

As shown in FIG. 1A, a gate oxide film 2 is grown on a substrate 1, for example, a single crystal silicon substrate, by a thermal oxidation process, followed by the deposition of a relatively thick gate polysilicon layer 3, which will be used for a gate electrode later, on the gate oxide film 2 and then, by the formation of an oxide film 4 on the gate polysilicon layer 3.

Figure 1B:
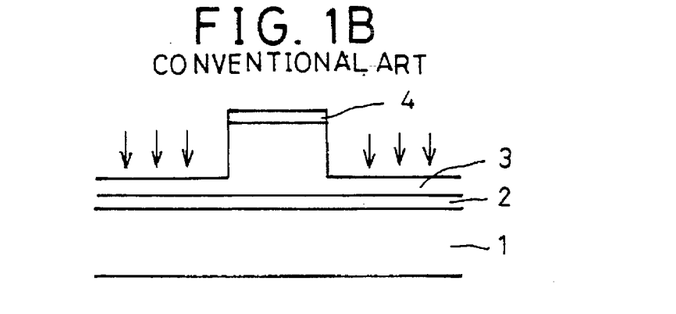

With reference to FIG. 1B, the oxide film 4 is selectively etched using a photosensitive film pattern (not shown) formed over the oxide film 4 as a mask, and the exposed area of the polysilicon layer 3 is dry etched to a thickness of about 100 to 500 Angstrom. After removing the photosensitive film pattern, an n type impurity, for example, phosphorus is implanted, as indicated by arrows, at a low dose and a high implantation energy into the substrate 1 except for an area maintaining its original thickness.

Figure 1C:
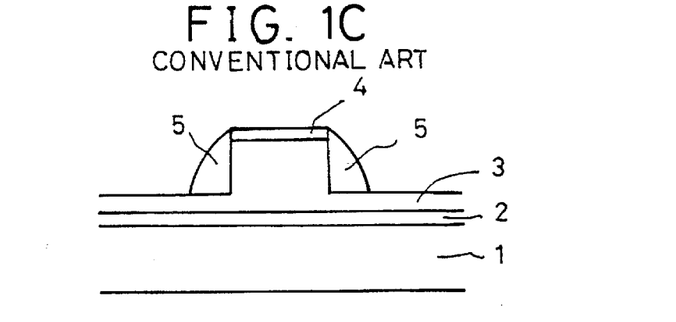

With reference to FIG. 1C, a blanket oxide film is deposited over the resulting structure of FIG. 1B by a chemical deposition process and subjected to etch back, to form a spacer 5 at the side wall of the area of polysilicon layer maintaining its original thickness. As will be described, the spacer 5 will serve as a mask to offset the ion implantation for drain/source of $n^+$, with the aim of optimizing the length of the $n^-$ diffusion region ($Ln^-$) in which the drain/source is overlapped with a gate to be formed later.

Figure 1D:
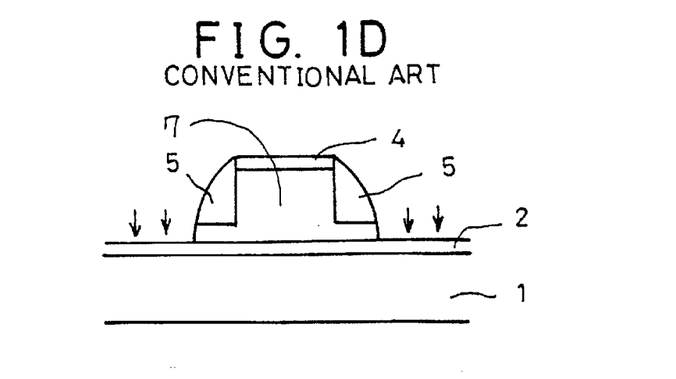

With reference to FIG. 1D, a plasma etch process is undertaken to remove the unmasked area of the polysilicon layer 3, resulting in the formation of an inverse T polysilicon gate 7, followed by the ion implantation of an n type impurity, for example, arsenic, into the substrate 1 at a high dose and a low energy while the spacer 5 serving as a mask.

Figure 1E:
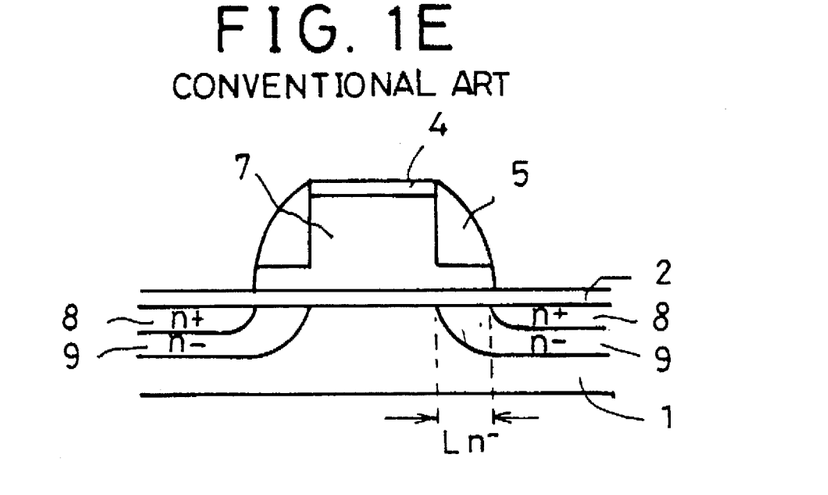

With reference to FIG. 1E, the already implanted ions are activated by a thermal treatment process, for example, rapid annealing process, to form the drain/source regions, each consisting of an $n^+$ diffusion region 8 and an $n^-$ diffusion region 9 which surrounds the $n^+$ diffusion region 8.

Therefore, the offset between the $n^+$ source/drain region and the gate is removed because the $n^+$ source/drain region is self-aligned with the inverse T gate 7 upon the ion implantation. In addition, the optimum length ($Ln^-$) is readily determined by the width of the spacer 7.

A significant problem of the conventional fabrication method of ITLDD is that the transistor exhibits nonuniform electrical properties. When the polysilicon layer is etched to a thin thickness, the resulting polysilicon layer is not uniform in thickness because etch processes are not precise, in general. Thus, the LDD of $n^-$ ions which is formed by implanting $n^-$ ions through the nonuniformly thinned polysilicon layer into the substrate and activating $n^-$ ions, is not uniform in density and junction depth because of the nonuniform thickness of the polysilicon layer etched.

Typically, a silicide is formed between a gate and a drain/source to solve the increase of gate resistance attributable to diminution of device. The conventional fabrication method of ITLDD, however, cannot utilize this silicide process, having a great difficulty in improving the performance of the ITLDD transistor.

SUMMARY OF THE INVENTION

Therefore, it is a principal object of the present invention to provide a gate-drain overlapped device comprising a silicide layer on a gate of polysilicon.

It is another object of the present invention to provide a very small diminutive gate-drain overlapped device which is improved in the conductivity of gate.

It is a further object of the present invention to provide a very small diminutive gate-drain overlapped device which shows uniform electrical properties.

It is still a further object of the present invention to provide a method for fabricating the gate-drain overlapped device.

In accordance with an aspect of the present invention, there is provided a gate-drain overlapped device, comprising: a first conductive type substrate; a gate insulating film formed on the substrate; a gate comprising a gate conductive line patterned on the gate insulating film, and a conductive layer coated on the gate conductive line and extending to a predetermined length on the gate insulating film; and a drain/source region comprising a second conductive type low density diffusion region in the substrate below the extending area of the conductive layer and a second conductive type high density diffusion region in contact with the low density diffusion region in the substrate.

In accordance with another aspect of the present invention, there is provided a method for fabricating a gate-drain overlapped device, comprising the steps of: patterning a gate conductive line on a gate insulating film atop a substrate; depositing a first conductive layer over the substrate including the gate conductive line; implanting a first impurity having a second conductive type into the substrate with said gate conductive line serving as a mask; converting said first conductive layer to a second conductive layer and patterning the second conductive layer; and implanting a second impurity having the second conductive type into the substrate with the pattern of said second conductive layer serving as a mask.

In accordance with a further aspect of the present invention, there is provided a method for fabricating a gate-drain overlapped device, comprising the steps of: patterning a gate conductive line on a gate insulating film atop a substrate; depositing a first conductive layer over the substrate including the gate conductive line; implanting a first impurity having a second conductive type into the substrate with said gate conductive line serving as a mask; converting said first conductive layer to a second conductive layer and patterning the second conductive layer; forming an insulating film spacer at the sidewall of the pattern of the second conductive layer; and implanting a second impurity having the second conductive type into the substrate with the pattern of said second conductive layer serving as a mask.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

The application of the preferred embodiments of the present invention is best understood with reference to the accompanying drawings, wherein like reference numerals are used for like and corresponding parts, respectively.

Figure 2:
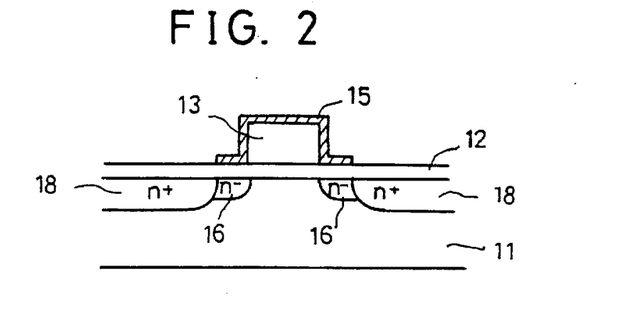
FIG. 2 is a schematic cross sectional view showing the gate-drain overlapped device according to the present invention.

FIG. 2 shows the gate-drain overlapped device according to the present invention which comprises a substrate 11, a gate insulating film 12 formed on the substrate 11, a gate consisting of a gate conductive line of polysilicon layer 13 formed on a predetermined area of the gate insulating film 12 and a silicide layer 15 coated on the surface of the gate conductive line 13 and extending to an area of the gate insulating film 12, and a drain/source region consisting of an $n^-$ diffusion region 16 formed in an area of the substrate 11 which is below the extending part of the silicide layer 15 and an $n^+$ diffusion region 18 which is in contact with the outer face of the $n^-$ diffusion region 16 in the substrate 11.

FIG. 3 shows the preferred process steps of fabricating such gate-drain overlapped device, in accordance with an embodiment of the present invention. These steps will be, in detail, described in connection with FIGS. 3A through 3F.

Figure 3A:
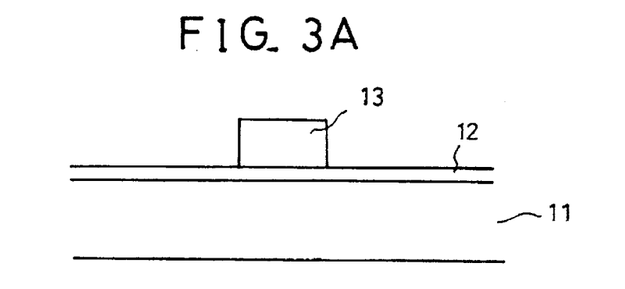
FIGS. 3A through 3F are schematic cross sectional views showing a fabrication method of the gate-drain overlapped device, in accordance with a first embodiment of the present invention.

First, as shown in FIG. 3A, a gate insulating film 12, for example, an oxide film is grown to 100 Angstrom on the surface of a substrate 11, for example, a single crystal substrate having a p type well (not shown), through thermal oxidation. Subsequently, a polysilicon layer is deposited to 2000 Angstrom and patterned to form a gate conductive line 13.

Figure 3B:
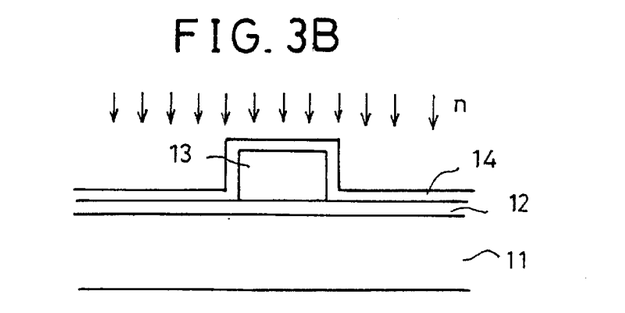

With reference to FIG. 3B, a metal layer 14, for example, a high melting point metal layer such as Ti, Co, Mo, Ta, Ni and W, is deposited to 500 Angstrom over the entire surface of the resulting structure of FIG. 3A, followed by the ion implantation of n type impurity into the substrate 11 for the purpose of forming an $n^-$ LDD. For the ion implantation, for example, phosphorus is implanted at a dose of 2.4 E13 ions/cm$^2$ and an energy of 50 keV, as indicated by arrows, while the gate conductive line serves as a mask.

Figure 3C:
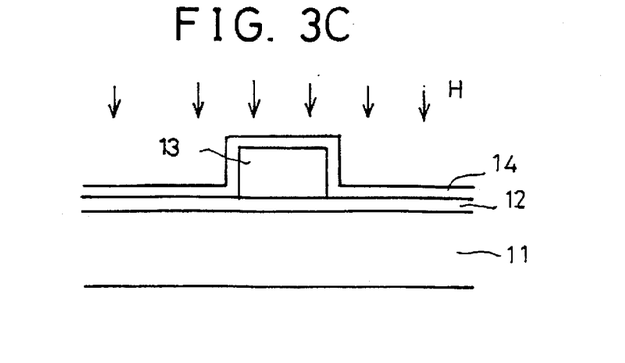

With reference to FIG. 3C, the grain boundary of the metal layer 14 is subjected to passivation by implanting hydrogen ions into the entire metal layer 14. Any of hydrogen plasma treating process, nitrogen ion implantation process, nitrogen plasma treating process and nitrogen annealing process may be used for the passivation of the metal layer 14.

Figure 3D:
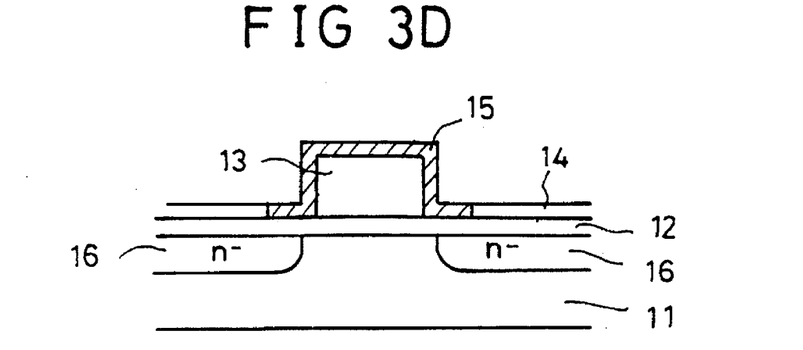

With reference to FIG. 3D, the metal layer 14 is annealed at a temperature of 500° to 800° C. in an inert atmosphere, to form a silicide layer 15. This annealing also allows the implanted ions to be activated, thereby forming an $n^-$ diffusion region 16 in the entire substrate 11 except for the area below the conductive line 13.

In more detail, the silicidation of a metal layer can be advanced only to the thickness of the metal layer by annealing it at different temperatures according to material properties of metal and controlling the annealing time. Based on this fact, the metal layer 14 is reacted into the silicide layer 15 at the gate conductive line 13 but not at the area away from the gate conductive line by the thickness of the metal layer 14.

Thereafter, a silicide offset is formed by extending the silicide layer to a desirable length through the annealing of the metal layer 14 which is maintained in its original state.

The metal silicide layer is formed by diffusing the polysilicon atoms of the gate conductive line 13 into the metal layer in contact with the polysilicon layer. Suitable metals for the metal layer 14 include Ti, Zr, Hf, V, Nb, Ta, Cr, Mo and W. Meanwhile, metals which can be diffused into a polysilicon layer in contact with the metals, to form a metal silicide layer, include Co, Ni, Pd and Pt.

Accordingly, in the case of the present invention, Ti, Zr, Hf, V, Nb, Ta, Cr, Mo and W are advantageous in controlling the overgrowth of the offset silicide layer.

Figure 3E:
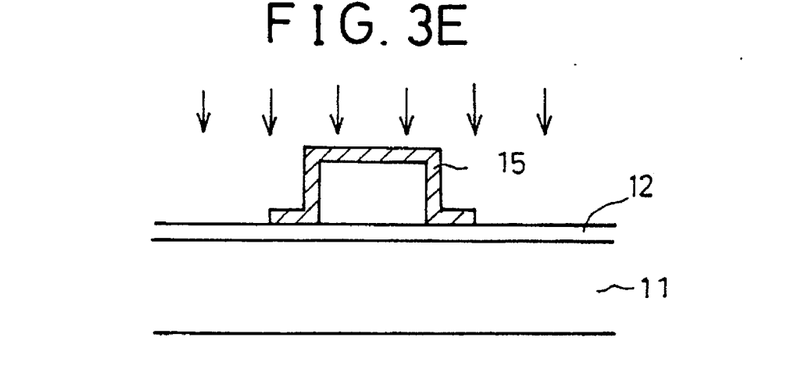

With reference to FIG. 3E, a wet etch process is undertaken to remove the non-silicide area of the metal layer 14, leaving the silicide layer 15 which is coated on the gate conductive line 13 and extends to the predetermined length, followed by the ion implantation of n type impurity into the substrate 11. For example, arsenic is implanted at a dose of 5.0 E15 ions/cm$^2$ and an energy of 40 keV, to form an n$^+$ drain/source region. At that moment, the silicide layer serves as a mask.

Figure 3F:
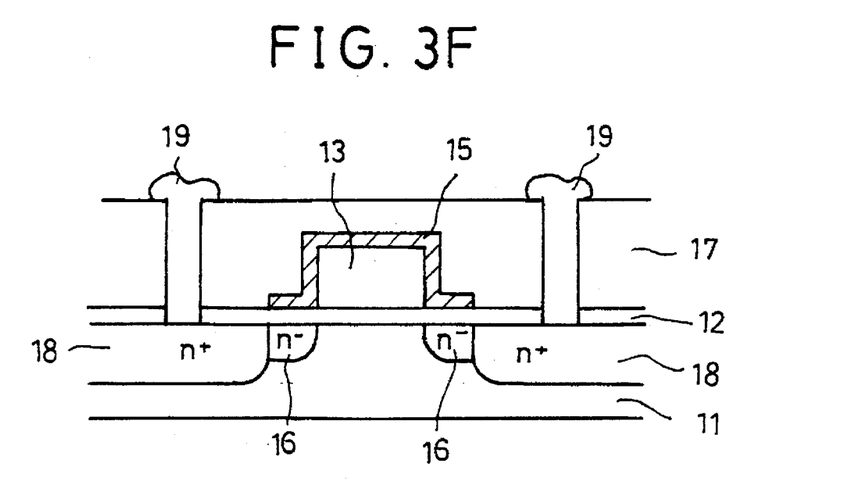

With reference to FIG. 3F, a blanket insulating film 17 is formed on the resulting structure of FIG. 3E and the substrate is thermally treated to activate the implanted arsenic ions, thereby forming an n$^+$ diffusion region 18 for drain/source.

As a result, the drain/source region consists of the n$^-$ diffusion region 16 formed in the substrate 11 below the offset area of the silicide layer and the n$^+$ diffusion region 18 in contact with the outer face of the n$^-$ diffusion region 16 in the substrate 11.

Thereafter, using a typical technique, a drain/source electrode is formed in such a way that it is electrically connected with the n$^+$ diffusion region 18 of the drain/source region through a contact hole of the insulating film 17.

Figure 4A:
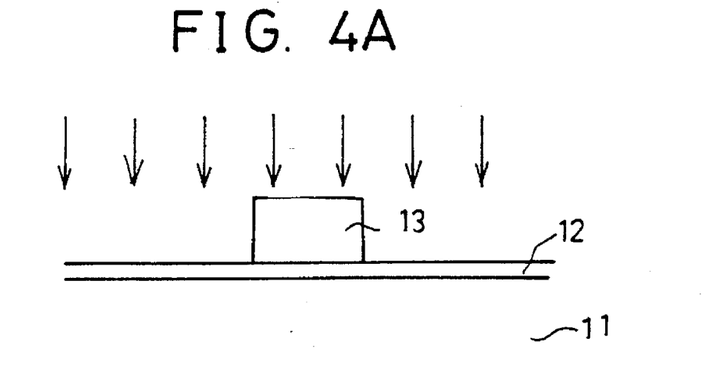
FIGS. 4A through 4C are schematic cross sectional views showing a fabrication method of the gate-drain overlapped device, in accordance with a second embodiment of the present invention.
Figure 4B:
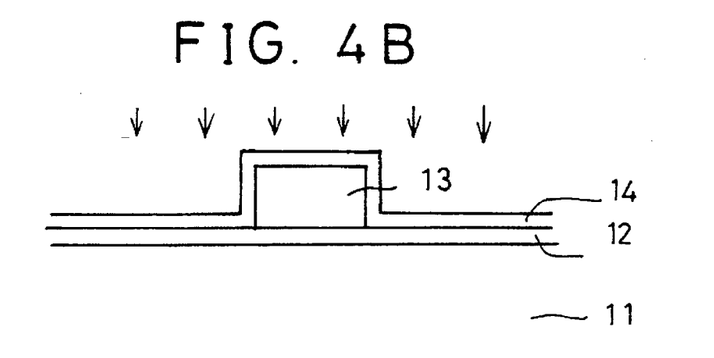
Figure 4C:
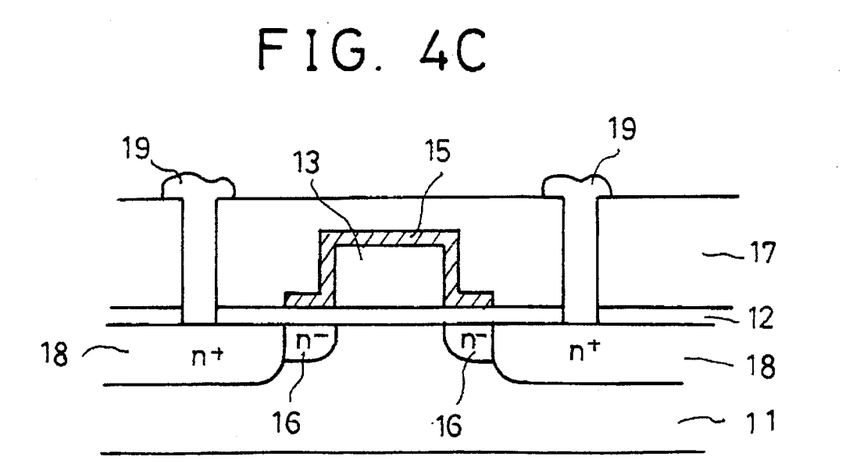

FIG. 4 shows the preferred process steps of fabricating a gate-drain overlapped device, according to another embodiment of the present invention.

First, with reference to FIG. 4A, after the same process steps as those of FIG. 3A are undertaken, n type impurity, for example, phosphorus is implanted at a dose of 2.4 E13 ions/cm$^2$ and an energy of 40 keV into the substrate 11, with the gate conductive line serving as a mask.

With reference to FIG. 4B, a metal layer 14 is deposited to 500 Angstrom on the resulting structure of FIG. 4A in the same manner as that of FIG. 3B. The grain boundary of the metal layer 14 is subjected to passivation by implanting hydrogen ions into the entire metal layer 14.

FIG. 4C shows the gate-drain overlapped device which is obtained by carrying out the same process steps as those of FIGS. 3D, 3D and 3F.

A further embodiment of the present invention is illustrated in FIGS. 5A through 5E.

Figure 5A:
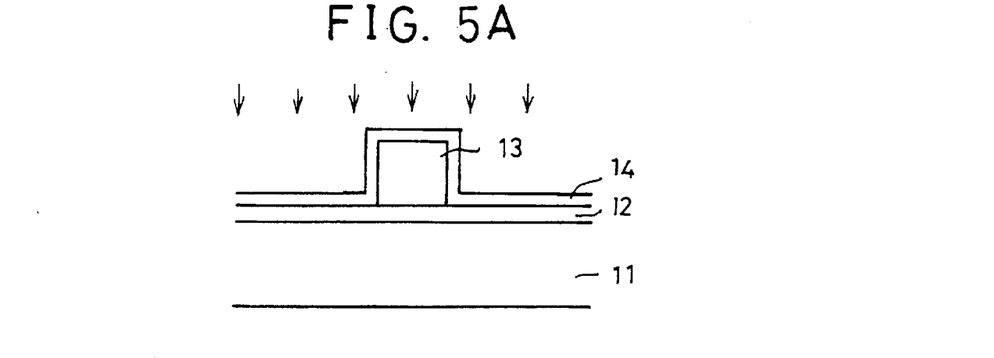
FIGS. 5A through 5E are schematic cross sectional views showing a fabrication method of the gate-drain overlapped device, in accordance with a third embodiment of the present invention.

FIG. 5A shows a cross section after the same process steps as those of FIGS. 4A and 4B are undertaken.

Figure 5B:
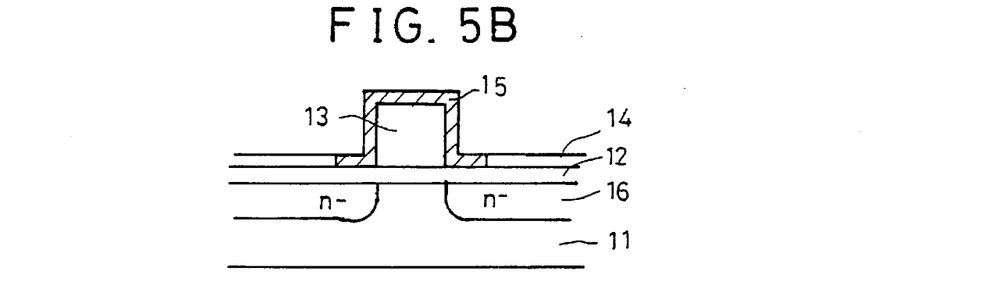

FIG. 5B shows a cross section after the same process steps as those of FIG. 3D are undertaken.

Figure 5C:
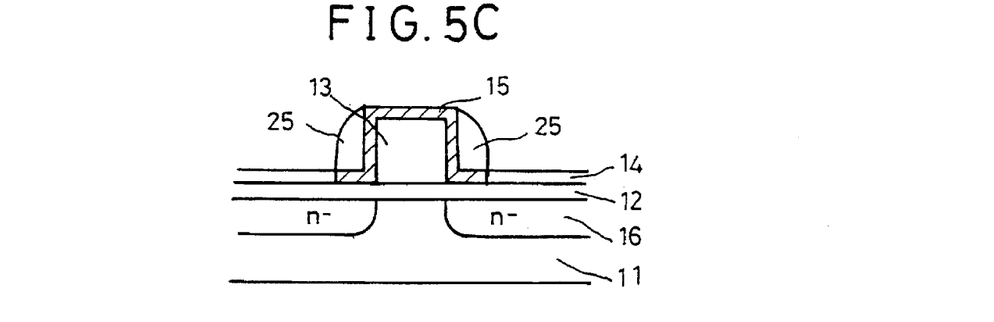

With reference to FIG. 5C, an insulating film, for example, an oxide film is deposited over the entire surface of the resulting structure of FIG. 5B and then, subjected to etch back, to form a spacer 25 at the sidewall of the silicide layer 15.

Figure 5D:
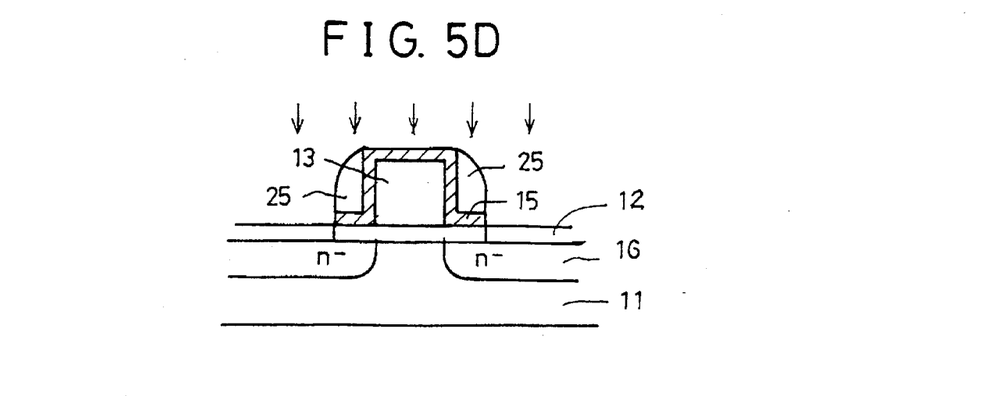

With reference to FIG. 5D, a wet etch process is undertaken to remove the non-silicide area of the metal layer 14, leaving the silicide layer 15 which is coated on the gate conductive line 13 and extends to the predetermined length, followed by the ion implantation of n type impurity into the substrate 11. For example, arsenic is implanted at a dose of 5.0 E15 ions/cm$^2$ and an energy of 40 keV, to form an n$^+$ drain/source region. Upon implanting arsenic, the silicide layer 15 serves as a mask.

FIG. 5D shows the gate-drain overlapped device which is obtained by carrying out the same process steps as those of FIG. 3F.

In this embodiment, it is obvious that, after the n$^-$ diffusion region 16 is formed in the presence of both the gate conductive line 13 and the metal layer 14, the same process steps as those of FIGS. 5B through 5E may be in sequence carried out.

Figure 5E:
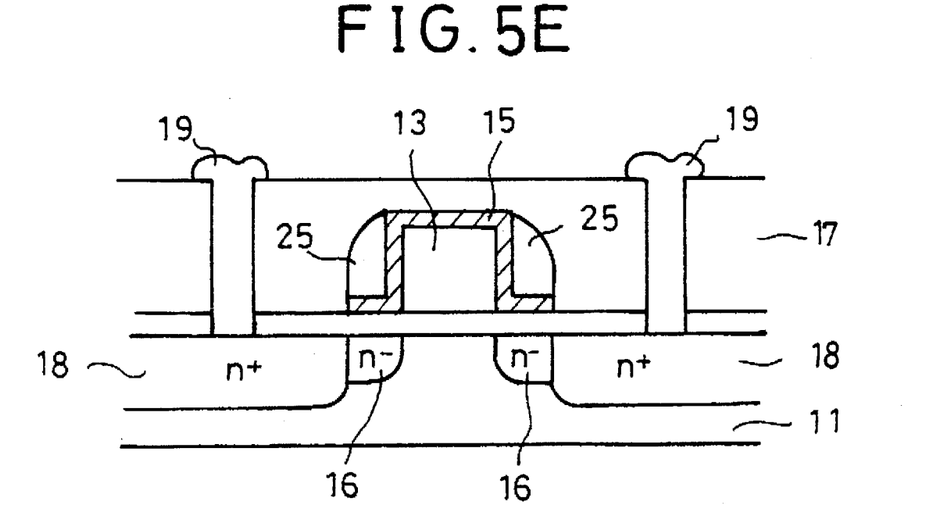

It is also obvious that the same process steps as those of FIGS. 5C through 5E may be in sequence undertaken in the condition that the metal layer 15 is not reacted into the silicide layer 15.

As described hereinbefore, the resistance of a polysilicon gate conductive line can be reduced by forming a silicide layer on the surface of the polysilicon gate conductive line, according to the present invention. In addition, uniform electrical properties can be accomplished in a GOLD transistor by extending the silicide layer to a desirable length which allows the n$^-$ diffusion region, a part of the source drain region, to be formed to a constant junction depth at a constant dope density in the substrate below the overlapped area between the gate and the source/drain.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for fabricating a gate-drain overlapped device, comprising the steps of:
    (a) patterning a gate conductive line on a gate insulating film formed on a substrate;
    (b) depositing a first conductive layer over the substrate including the gate conductive line;
    (c) implanting a low density of a first impurity having a second conductivity type into the substrate with said gate conductive line serving as a mask after steps (a) and (b);
    (d) converting said first conductive layer to a second conductive layer and patterning the second conductive layer; and
    (e) implanting a high density of a second impurity having the second conductivity type into the substrate with the pattern of said second conductive layer serving as a mask after the step (c).

2. A method in accordance with claim 1, wherein said patterning step of the second conductive layer comprises subjecting the first conductive layer to passivation, annealing the passivated first conductive layer to form a second conductive layer which surrounds the gate conductive line and extends to a length on the gate insulating film, and removing the entire first conductive layer except for the area of the second conductive layer.

3. A method in accordance with claim 1, wherein said second conductive layer is formed by subjecting the gate conductive line and the first conductive layer to silicidation.

4. A method in accordance with claim 1, wherein said first impurity having second conductivity type is activated to form a low density diffusion region at the converting step.

5. A method in accordance with claim 1, wherein said second impurity having second conductivity type is activated to form a high density diffusion region.

6. A method in accordance with claim 2, wherein said passivation of the conductive layer is performed by implanting hydrogen ions.

7. A method in accordance with claim 2, wherein said passivation of the conductive layer is performed by any one technique selected from the group consisting of hydrogen plasma treating process, nitrogen ion implantation process, nitrogen plasma treating process and nitrogen annealing process.

8. The method in accordance with claim 1, wherein said first conductive layer comprises a material selected from a group consisting of Ti, Zr, Hf, V, Nb, Ta, Cr, Mo, W, Co, Ni, Pd and Pt.

9. The method in accordance with claim 1, wherein said low density of said first impurity comprises a dose of 2.4 E13 phosphorous ions/cm$^2$, and said high density of said second impurity comprises a dose of 5.0 E15 arsenic ions/cm$^2$.

* * * * *